United States Patent
Tihanyi et al.

(10) Patent No.: US 7,091,533 B2
(45) Date of Patent: Aug. 15, 2006

(54) SEMICONDUCTOR COMPONENT

(75) Inventors: Jenö Tihanyi, Kirchheim (DE); Gerald Deboy, München (DE)

(73) Assignee: Infineon Technologies AG, Munich (DE)

(*) Notice: Subject to any disclaimer, the term of this patent is extended or adjusted under 35 U.S.C. 154(b) by 13 days.

(21) Appl. No.: 10/842,810

(22) Filed: May 11, 2004

(65) Prior Publication Data
US 2005/0012121 A1    Jan. 20, 2005

(30) Foreign Application Priority Data
May 12, 2003    (DE) ................. 103 21 222

(51) Int. Cl.
*H01L 31/062* (2006.01)
(52) U.S. Cl. .................... 257/256; 257/339
(58) Field of Classification Search ........ 257/256, 257/339, 260, 330
See application file for complete search history.

(56) References Cited

U.S. PATENT DOCUMENTS

| | | | |
|---|---|---|---|
| 4,982,260 A * | 1/1991 | Chang et al. ......... 257/656 |
| 5,177,572 A * | 1/1993 | Murakami ........... 257/260 |
| 5,623,151 A * | 4/1997 | Ajit ..................... 257/212 |
| 6,040,600 A | 3/2000 | Uenishi et al. |
| 6,201,279 B1 * | 3/2001 | Pfirsch ................ 257/333 |
| 6,445,038 B1 * | 9/2002 | Tihanyi ............... 257/347 |
| 6,621,132 B1 * | 9/2003 | Onishi et al. ........ 257/409 |
| 2002/0179942 A1 | 12/2002 | Tihanyi |

OTHER PUBLICATIONS

Singh, Ranbir et al., "High-Power 4H-SiC JBS Rectifiers," IEEE Transactions on Electron Devices, vol. 49, No. 11, pp. 2054-2063 (Nov. 2002).

* cited by examiner

*Primary Examiner*—David Nelms
*Assistant Examiner*—Thinh T Nguyen
(74) *Attorney, Agent, or Firm*—Dicke, Billig & Czaja, PLLC

(57) ABSTRACT

The invention relates to a semiconductor component, in which regions of the conduction type opposite to the conduction type of the drift zone are incorporated in the drift zone and also in the region of the active zones.

14 Claims, 4 Drawing Sheets

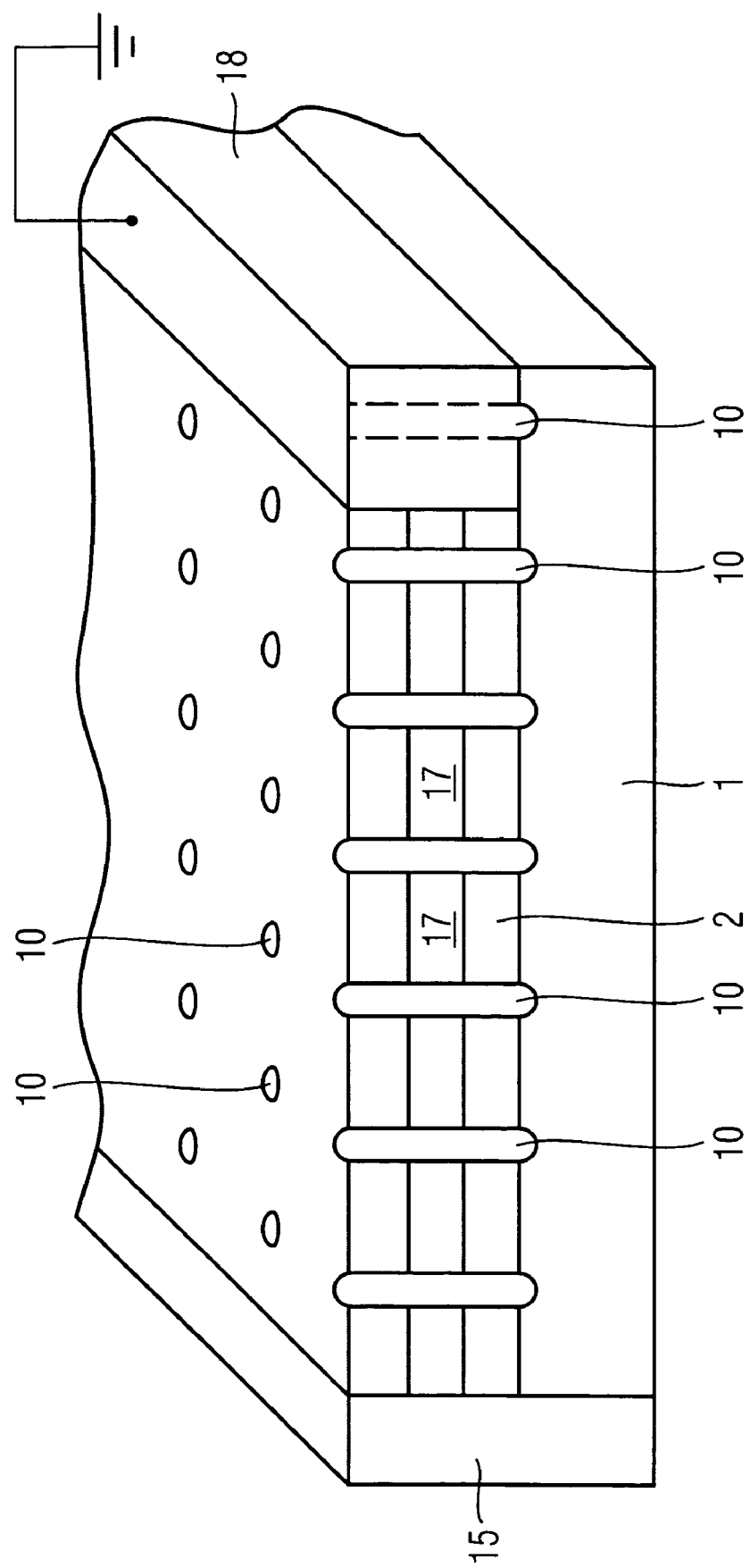

SEMICONDUCTOR COMPONENT

CROSS-REFERENCE TO RELATED APPLICATIONS

This Utility Patent Application claims priority to German Patent Application No. DE 103 21 222.1, filed on May 12, 2003, which is incorporated herein by reference.

BACKGROUND

The invention relates to a semiconductor component having at least two electrodes that are provided on a semiconductor body and a drift zone of one conduction type, which is located between the at least two electrodes in the semiconductor body.

DE 198 00 647 C1 describes an SOI high-voltage switch having an FET structure, in which a drift zone of one conduction type is provided between a gate electrode and a drain electrode in the drain region. Incorporated in this drift zone are pillar-like trenches in the form of a lattice which are filled with semiconductor material of the other conduction type. An SOI high-voltage switch, which can be produced in a simple manner for practically any desired lateral extents and has a high dielectric strength in conjunction with a low on resistance, is intended to be provided in this manner.

Junction Barrier Schottky (JBS) diodes, the semiconductor body of which comprises silicon carbide for enhancing the performance and increasing the switching speed, are furthermore disclosed in IEEE Transactions on Electron Devices, Vol. 49, No. 11, November 2002, Ranbir Singh et al. "High-Power 4H-SiC JBS Rectifiers".

SUMMARY

In one embodiment of the present invention, a semiconductor component is provided with a drift zone having an optimized configuration with regard to performance and switching speed.

In one embodiment, a semiconductor component has two electrodes provided on a semiconductor body. The semiconductor component also has a drift zone of one conduction type located between two electrodes. Also, regions of another conduction type, opposite to said one conduction type, are incorporated in the drift zone and in that region of the semiconductor body that adjoins the electrodes.

In one embodiment, these regions of the other conduction type may, for example, be pillar-like regions that may be of cohesive or isolated configuration and may be floating or at a particular potential. The regions may be produced as trenches that are filled with semiconductor material of the other conduction type. The semiconductor material of the semiconductor body is used for the semiconductor material in this case.

In one embodiment of the semiconductor component according to the invention, the regions of the other conduction type are provided not only in the actual drift zone but also in the region of the at least two electrodes, that is, in active regions of the semiconductor component. If the semiconductor component is, for example, a MOSFET or a JFET, this embodiment of the regions of the other conduction type limits the field strength in the channel region and the characteristic curves of the semiconductor component become essentially independent of the drain voltage. In other words, the characteristic curves then assume a profile similar to that of the characteristic curves of pentodes.

In addition to a MOSFET or a JFET, the semiconductor component may also be a Schottky diode, a JBS diode, an IGBT (insulated gate bipolar transistor), or other semiconductor component.

Silicon, silicon carbide, compound semiconductors, or others may be selected for the semiconductor material of the semiconductor body. In one embodiment, the semiconductor body comprises silicon carbide since high switching speeds can be achieved therewith.

In one embodiment, the n conduction type is used for said one conduction type. The regions of the other conduction type that are incorporated in the drift zone and in the region of the electrodes then have the p conduction type. In the case of a high-voltage Schottky diode, the charge balance in the drift zone should be set in such a manner that the n conduction type predominates overall. There should be n-type loading.

In the latter case, the drift zone and the regions adjoining the diodes may, for example, comprise a plurality of n- and p-conducting layers. It is possible for the p-conducting layers to be connected to one another via pillar-like regions of the other conduction type that are introduced by means of trenches. In one embodiment, n-type loading predominates overall. However, the conduction types specified in the exemplary embodiments may also be reversed, if appropriate.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a variant for the configuration of the drift zone in the exemplary embodiment of FIG. 3 in a diagrammatic sectional.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
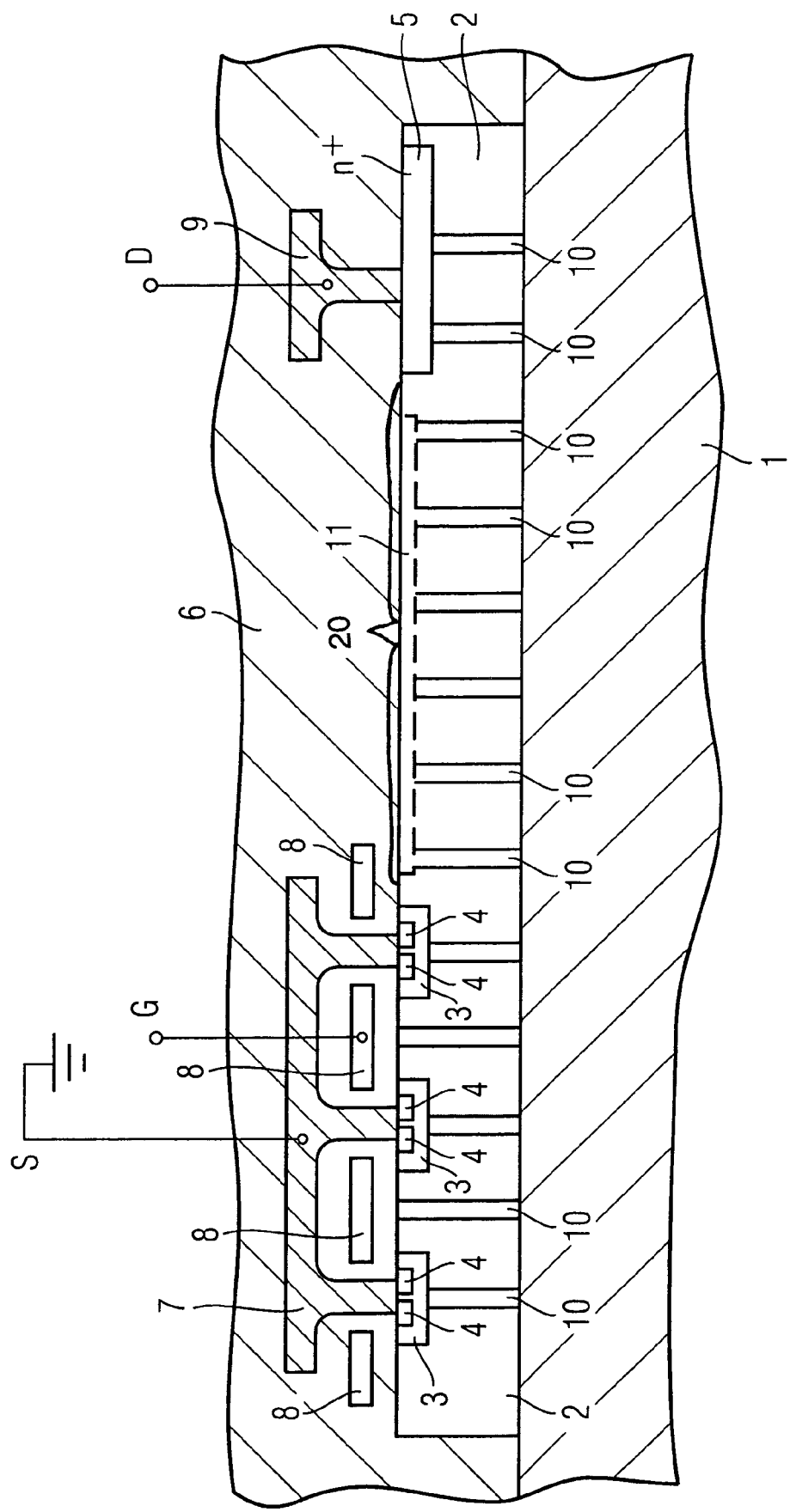
FIG. 1 illustrates a diagrammatic sectional through a MOSFET in accordance with a first exemplary embodiment of the invention.

FIG. 1 illustrates a MOSFET in an SOI structure having an insulator 1, to which a semiconductor layer 2 composed, for example, of n-doped silicon or silicon carbide is applied. Situated in the semiconductor layer 2 are p-doped zones 3, which act as body zones and into which n+-doped source zones 4 are introduced. In addition, an n+-doped drain zone 5 is also provided in the semiconductor layer 2. A source metallization 7 and gate electrodes 8 and also a drain metallization 9 are situated in an insulating layer 6 composed, for example, of silicon dioxide on the semiconductor layer 2. The source metallization 7, the gate electrodes 8 and the drain metallization 9 may, for example, comprise aluminum or polycrystalline silicon.

The source metallization 7 is connected to a source contact S, which is at reference ground potential (0 V). The gate electrodes 8 are connected to a gate contact G and the drain metallization 9 is connected to a drain contact D. Polycrystalline silicon may be used for the gate electrode 8.

According to one embodiment of the invention, p+-conducting regions 10 are incorporated in the semiconductor layer 2 in the entire drift zone 20 between the drain zone 5 and the body zones 3 and also in that region of the semiconductor layer 2 which adjoins the drain zone 5 and the body zones 4. These regions 10 may be formed by trenches into which p+-doped semiconductor material, that is to say silicon or silicon carbide, is filled.

The regions 10 may be floating or partially connected to the body zones 3 or to the drain zone 5. It is also possible to connect the drain zones 10 to one another by means of a p-conducting layer 11, which is in the form of a lattice. However, it is possible to dispense with this layer 11. It is merely optional.

Figure 2:
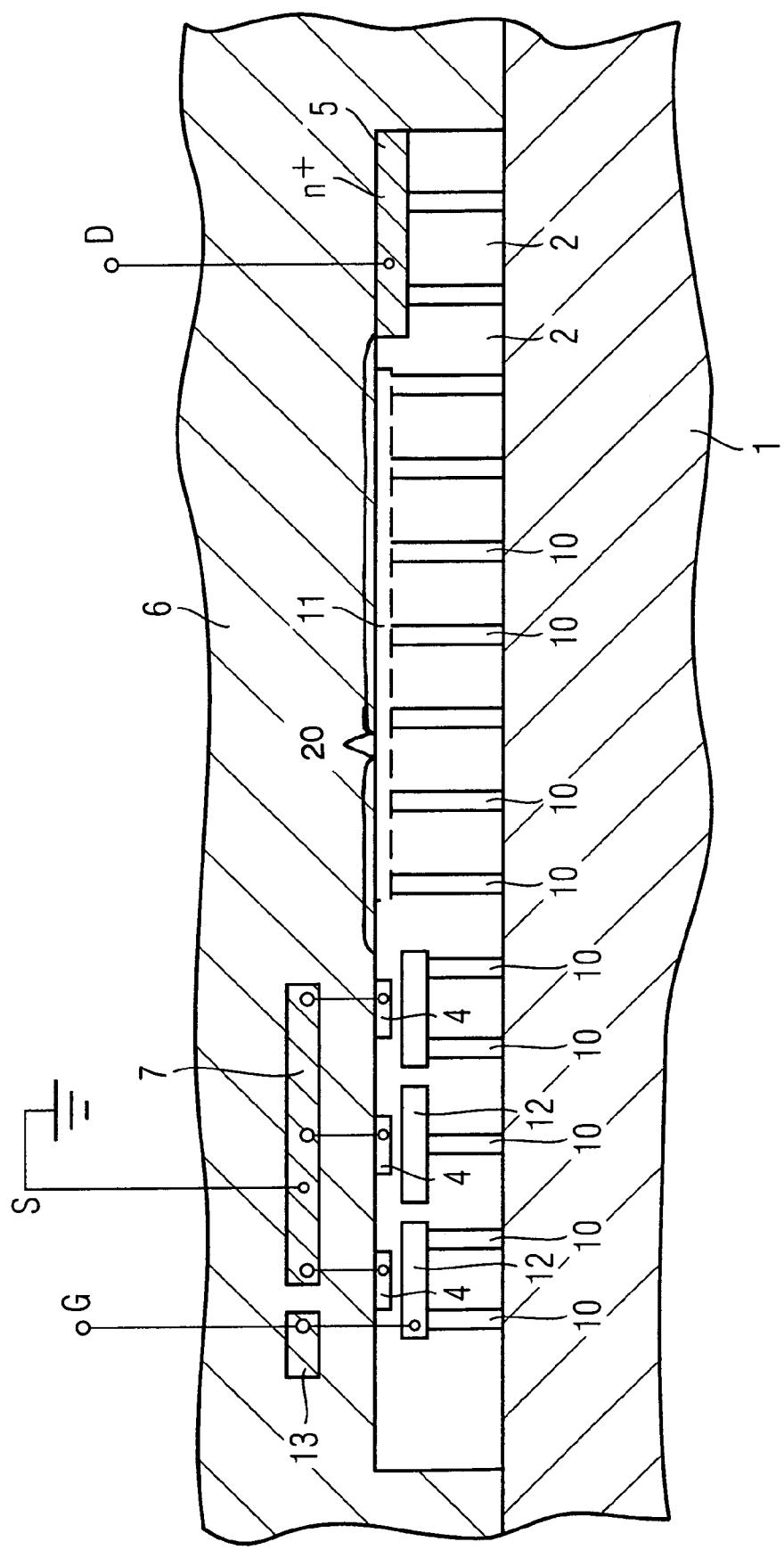
FIG. 2 illustrates a diagrammatic sectional through a JFET in accordance with a second exemplary embodiment of the present invention.

FIG. 2 illustrates, in another sectional diagram, a further exemplary embodiment of the semiconductor component according to the invention. In this embodiment, a JFET is illustrated. In this exemplary embodiment, p-conducting gate regions 12 which are connected to a gate metallization 13 embedded in the insulating layer 6 are provided in the semiconductor layer 2. Polycrystalline silicon may be used for said metallization 13.

In the exemplary embodiment of FIG. 2, the p-conducting regions 10 are provided in the entire region of the drift zone 20 between the source zones 4 and the drain zone 5 and also in the region below the drain zone 5 and the source zone 4. Said regions 10 may, if appropriate, be connected to one another by means of a p-conducting layer 11—as in the exemplary embodiment of FIG. 1—or be partially floating or connected to the source zone 5 or the gate regions 12.

Figure 3:
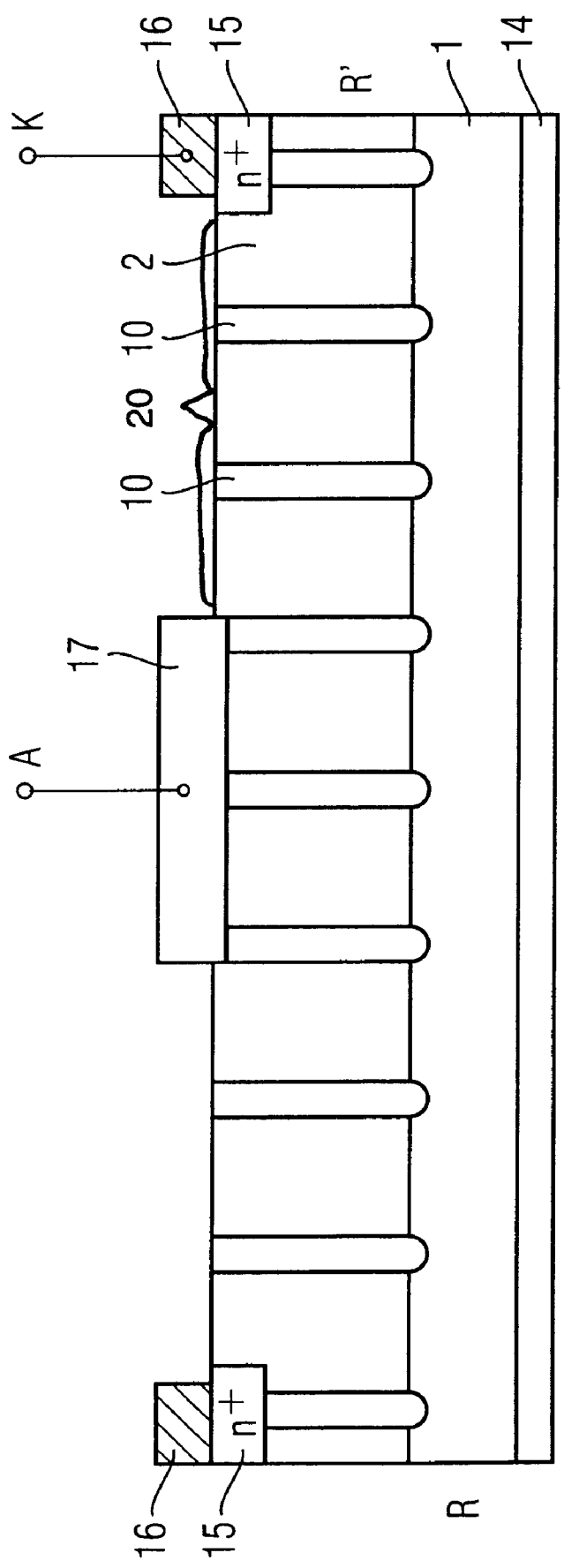
FIG. 3 illustrates a diagrammatic sectional through a Schottky diode in accordance with a third exemplary embodiment of the present invention.

FIG. 3 illustrates, in a sectional diagram, a third exemplary embodiment of the invention. In this embodiment, a Schottky diode is illustrated having an n-conducting semiconductor layer 2 composed, for example, of silicon carbide on a semi-insulating substrate 1, which may be provided on its rear side with an n-doped field stop layer 14 or an insulator layer or a metallization.

The p+-doped regions 10 extend through the n-doped semiconductor layer 2 from chip edge R to chip edge R'. In addition, provision is made of an n+-conducting cathode layer 15 having a cathode metallization 16 and an anode metallization 17, which forms a Schottky contact with the semiconductor layer 2. The anode metallization 17 is connected to an anode contact A, while the cathode metallization 16 is connected to a cathode contact K.

In the lateral Schottky diode shown in the exemplary embodiment of FIG. 3, the p+-conducting regions 10 extend over the entire drift zone 20 between the anode metallization 17 and the cathode metallization 16 and over the regions below the cathode zone 15 and the Schottky contact.

FIG. 4 illustrates a variant for the configuration of the drift zone in a Schottky diode. In this variant, a p-conducting semiconductor layer 17 is embedded in the n-conducting semiconductor layer 2. If appropriate, more than one p-conducting layer 17 may also be present. The p+-conducting regions 10 are connected to one another by means of said p-conducting layer 17 and are connected to a fixed potential, for example 0 V, via a p-conducting connection region 18.

In the variant of FIG. 4, the sum of the n-type charge should outweigh the sum of the p-type charge, that is to say n-type loading should be present, in the region of the drift zone.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor having a lateral arrangement comprising:
    a drift zone formed on a substrate;
    a first electrode coupled to the drift zone at a first lateral location; and
    a second electrode coupled to the drift zone at a second lateral location spaced apart from the first lateral location;
    wherein the drift zone is of a first conduction type between the first and second lateral locations, wherein regions of a second conduction type are incorporated in the drift zone and including in the first and second locations, and wherein the regions of the second conduction type alternate with regions of the drift zone along a direction pointing from the first lateral location to the second lateral location.

2. The semiconductor component of claim 1, wherein the drift zone is located on a substrate.

3. The semiconductor component of claim 2, wherein the substrate is insulating or semi-insulating.

4. The semiconductor component of claim 1, wherein the regions of the second conduction type are of cohesive configuration.

5. The semiconductor component of claim 4, wherein the regions of the second conduction type are connected to one another by means of a layer of the second conduction type.

6. The semiconductor component of claim 5, wherein the layer of the second conduction type is routed close to the surface or in the drift zone.

7. The semiconductor component of claim 1, wherein the semiconductor component is a MOSFET.

8. The semiconductor component of claim 1, wherein the semiconductor component is a JFET.

9. The semiconductor component of claim 1, wherein the semiconductor component is a Schottky diode.

10. The semiconductor component of claim 1, wherein the regions of the second conduction type are in the form of pillars.

11. The semiconductor component of claim 1, wherein said one conduction type predominates in the region of the drift zone.

12. The semiconductor component of claim 11, wherein said one conduction type is the n conduction type.

13. The semiconductor component of claim 1, wherein the regions of said one conduction type are floating.

14. The semiconductor component of claim 1, wherein the regions of said one conduction type are at a fixed potential.

* * * * *